United States Patent [19]
Goetschel et al.

[11] Patent Number: 5,491,441
[45] Date of Patent: Feb. 13, 1996

[54] METHOD AND APPARATUS FOR GENERATING A CLOCK SIGNAL FROM A CONTINUOUS OSCILLATOR SIGNAL INCLUDING A TRANSLATOR CIRCUIT

[75] Inventors: Christian J. Goetschel; Robert A. Greene; Robert A. Kertis; Rick A. Philpott; Raymond A. Richetta, all of Rochester; Timothy J. Schmerbeck, Kasson; Donald J. Schulte, Rochester; David P. Swart, Pine Island, all of Minn.

[73] Assignee: International Business Machines Corporation, Armonk, N.Y.

[21] Appl. No.: 269,197

[22] Filed: Jun. 30, 1994

[51] Int. Cl.⁶ .................................................. H03K 13/02
[52] U.S. Cl. ........................... 327/291; 327/91; 327/292; 331/74; 331/158; 331/186; 326/21; 326/39; 326/93
[58] Field of Search .................................... 327/291, 292, 327/298, 299, 91; 331/57, 74, 158, 186; 341/122, 136

[56] References Cited

U.S. PATENT DOCUMENTS

| | | | |
|---|---|---|---|
| 4,613,829 | 9/1986 | Ott | 331/59 |
| 4,616,145 | 10/1986 | Myers | 307/555 |
| 4,633,222 | 12/1986 | Dingwall | 340/347 SH |
| 4,691,122 | 9/1987 | Schnizlein et al. | 307/279 |
| 4,715,052 | 12/1987 | Stambaugh | 377/108 |
| 4,902,917 | 2/1990 | Simpson | 307/465 |
| 5,036,230 | 7/1991 | Bazes | 307/527 |
| 5,038,118 | 8/1991 | Langenkamp | 331/57 |
| 5,124,571 | 6/1992 | Gillingham et al. | 327/258 |
| 5,212,411 | 5/1993 | Asazawa | 307/279 |
| 5,220,217 | 6/1993 | Scarrá et al. | 307/481 |
| 5,357,204 | 10/1994 | Knoll | 328/62 |

*Primary Examiner*—Timothy P. Callahan
*Assistant Examiner*—Kenneth B. Wells
*Attorney, Agent, or Firm*—Joan Pennington

[57] ABSTRACT

A method and apparatus are provided for translating small voltage continuous signals into large full supply signals to generate a clock signal. At least one oscillator input signal is applied to a first amplifier stage for generating an amplified voltage output signal. A first inverter is coupled to the first amplifier stage. A second inverter is coupled to the first inverter. An AC coupling capacitor couples the amplified voltage output signal to the first inverter input, and a feedback resistor is connected between the output and input of the first inverter.

15 Claims, 2 Drawing Sheets

METHOD AND APPARATUS FOR GENERATING A CLOCK SIGNAL FROM A CONTINUOUS OSCILLATOR SIGNAL INCLUDING A TRANSLATOR CIRCUIT

BACKGROUND OF THE INVENTION

1. Field of the Invention

The present invention relates to a method and apparatus for translating small voltage continuous signals into large full supply signals while maintaining or restoring a substantially constant duty cycle of approximately 50% to generate a clock signal for clocking integrated circuits.

2. Description of the Prior Art

Many integrated circuits, such as memory devices and microprocessors, require a continuous clock signal having a relatively large voltage swing. Voltage controlled oscillators (VCOs) of various types have been used to generate a main clock on chip for clocking logic. Either differential oscillator signals or single-ended oscillator signals are used. The signals within an oscillator usually have swings of fairly small magnitude, typically 100 mV to 1 volt. This low voltage oscillating signal must be translated or converted from the small swing to a large swing for driving complementary metal oxide semiconductor (CMOS) logic. Also, the translator should generally maintain a constant duty cycle of approximately 50%. The ideal 50% duty cycle goal allows for maximum timing flexibility within the logic.

An inherent problem with known voltage translator arrangements is an unsymmetrical path for generating a high versus a low output signal. This asymmetry problem causes a deviation from an ideal duty cycle of 50%. In general, disadvantages of known clock signal generating circuit arrangements include their complexity, the large circuit space required and the difficulty and expense of manufacture.

SUMMARY OF THE INVENTION

Important objects of the present invention are to provide an improved method and apparatus for translating small voltage continuous signals into large full supply signals; to provide such a signal translator method and apparatus adapted for maintaining or restoring a substantially constant duty cycle of approximately 50%; and to provide such a signal translator method and apparatus that facilitate efficient and reliable operations and that overcome many of the disadvantages of prior art arrangements.

In brief, the objects and advantages of the present invention are achieved by a method and apparatus for translating small voltage continuous signals into large full supply signals to generate a clock signal. At least one oscillator input signal is applied to a first amplifier stage for generating an amplified voltage signal. A first inverter is coupled to the first amplifier stage. A second inverter is coupled to the first inverter. An AC coupling capacitor couples the amplified voltage signal to the first inverter input, and a feedback resistor is connected between the output and input of the first inverter.

BRIEF DESCRIPTION OF THE DRAWINGS

The present invention, together with the above and other objects and advantages, can best be understood from the following detailed description of the embodiment of the invention illustrated in the drawings, wherein.

DETAILED DESCRIPTION OF THE PREFERRED EMBODIMENTS

Figure 1:
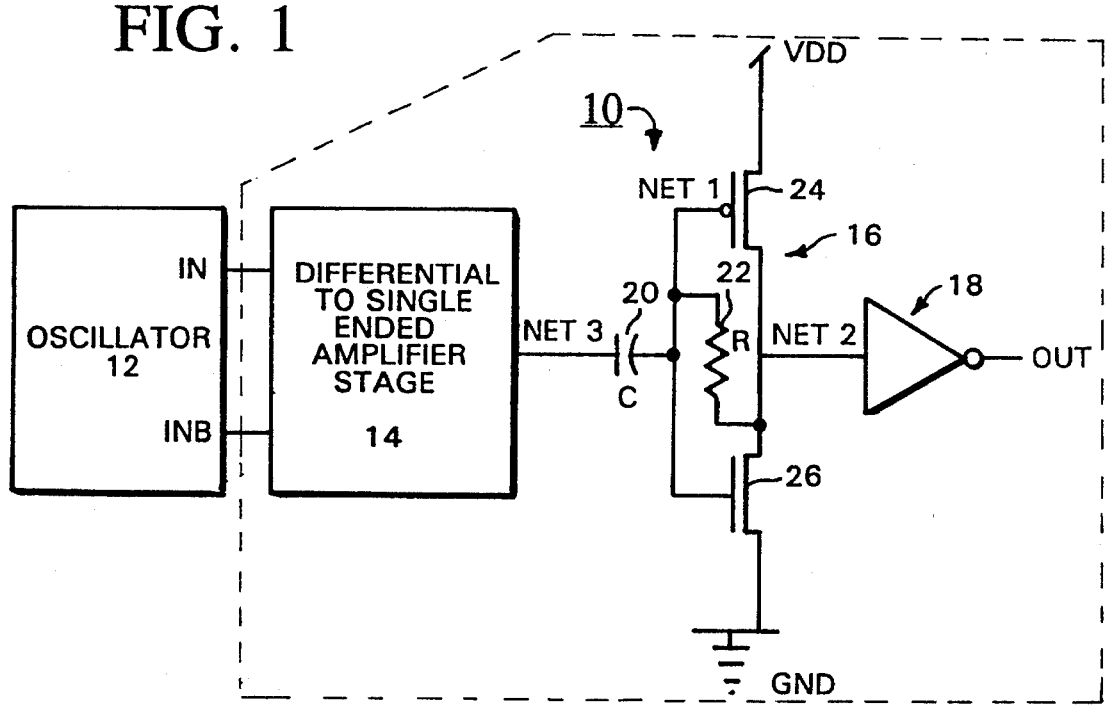
FIG. 1 is a partly schematic and block diagram of circuitry for translating small voltage continuous signals into large full supply signals while maintaining or restoring a substantially constant duty cycle of approximately 50% in accordance with the invention.

Referring now to the drawings, in FIG. 1 there is illustrated a partly schematic and block diagram representation of apparatus for translating small voltage continuous signals into large full supply signals according to the invention generally designated by the reference numeral 10. Translator circuit 10 receives differential small voltage outputs labelled IN and INB from an associated oscillator 12 and generates at its output a clock signal for clocking integrated circuits labelled OUT. Oscillator 12 can be a ring oscillator providing differential outputs, for example, in a range between 50 MHz to 200 MHz or higher, corresponding to a cycle period in a range from 20 nS to 5 nS.

Translator circuit 10 includes a differential to single-ended amplifier stage 14 that generates a large fixed swing output signal, a first inverter generally designated as 16 and a second inverter 18. The second inverter 18 driven by the first inverter 16, provides the translated voltage output signal OUT. An AC coupling capacitor (C) 20 is connected between the differential to single-ended amplifier stage 14 and the first inverter 16. A feedback resistor 22 is connected between the input labelled NET 1 and output labelled NET 2 of the first inverter 16. Inverter 16 includes a P-channel field effect transistor (PFET) 24 and a N-channel field effect transistor (NFET) 26 connected in series between the supply voltage VDD of, for example, plus 3 volts for CMOS logic and ground potential. A gate input of the PFET 24 and NFET 26 at NET 1 is connected at a junction of the resistor 22 and capacitor 20.

It should be understood that while the oscillator 12 as shown provides differential oscillator signals, a single-ended oscillator signal could be applied to the translator circuit 10. With a single-ended oscillator signal, an amplifier stage would be provided instead of the differential to single-ended amplifier stage 14 for generating a large fixed swing output signal. Inverters 16 and 18 are not limited to a CMOS implementation. Inverters 16 and 18 can be implemented by generally any inverting structure, for example, using NMOS or gallium arsenide (GaAs) technology.

Feedback resistor 22 has a high value, such as 200 Kohms with capacitor 20 having a selected value, such as 2 pF. Both resistor 22 and capacitor 20 can be implemented with discrete or integrated devices, such as on-chip FETs. Translator circuit 10 substantially avoids the asymmetric path and provides tighter control of duty cycle over process, supply and temperature variation, especially at higher frequencies. Feedback resistor 22 establishes the trip point at NET 1 within a short time interval, for example, such as 1000–2000 nS.

The large swing signal output labelled NET 3 of the differential to single-ended amplifier stage 14 is AC coupled by capacitor 20 to the input NET 1 of the first inverter 16. Translator circuit 10 functions over a large supply voltage range and is generally insensitive to noise when the voltage swing at NET 3 is greater than twice the noise level.

Translator circuit 10 provides improved control of the output duty cycle as compared to conventional arrangements. Translator circuit 10 also provides an output duty cycle at about 50% when the input duty cycle is not 50%. Translator circuit 10 can compensate for duty cycle variation inherent within the associated oscillator 12, for example, such as duty cycle variation arising from mismatches in device characteristics within the oscillator 12.

Operation of the translator circuit 10 may be understood as follows. A time constant, determined by the capacitor 20 and resistor 22, determines the charge-up time of the voltage at NET 1 to reach the trip-point of the first inverter 16. The RC time constant is chosen to be approximately 100 times greater than the largest period of the oscillator 12. As the supply voltage VDD changes, the voltage difference is compensated by the capacitor 20. The feedback resistor 22 maintains the voltage of NET 1 at the inverter trip-point on the average. A common mode level shift at NET 3 causes the average voltage of NET 1 to vary, until the feedback resistor 22 effectively adjusts the voltage at NET 1. The feedback resistor 22 adjusts the voltage of NET 1 to compensate for mismatch of the NFET and PFET devices.

Figure 2:
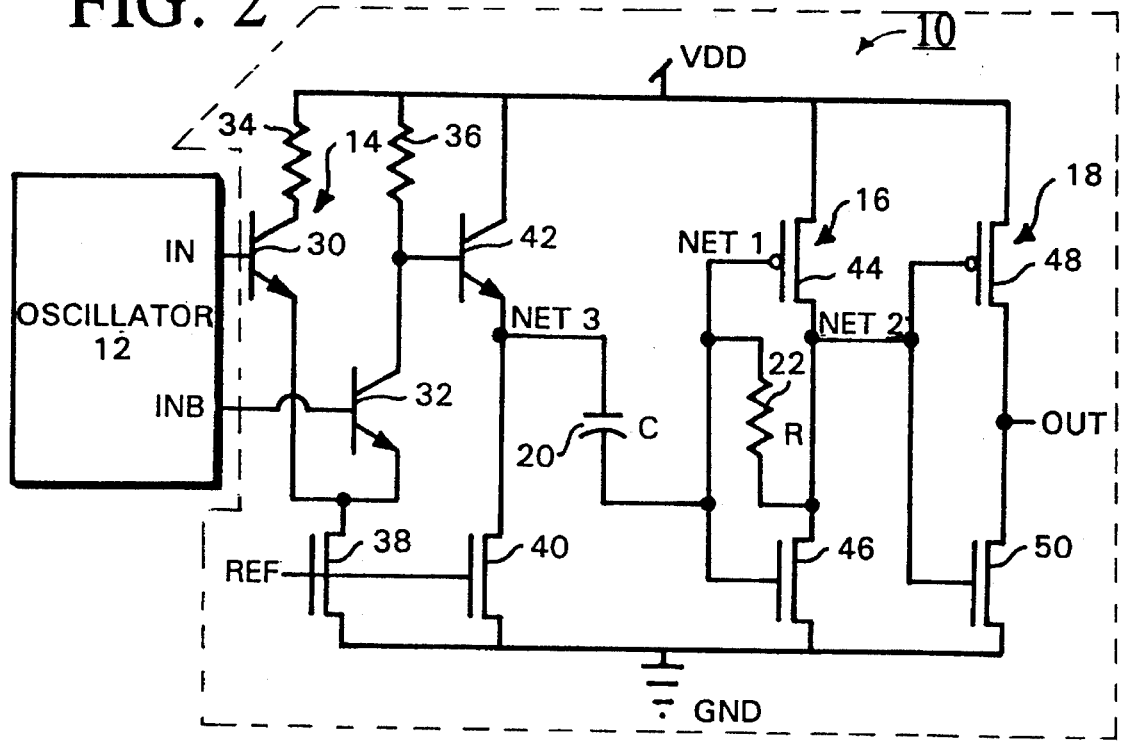
FIGS. 2 and 3 are partly schematic and block diagrams illustrating representative circuits for implementing the clock generating circuitry of FIG. 1.
Figure 3:
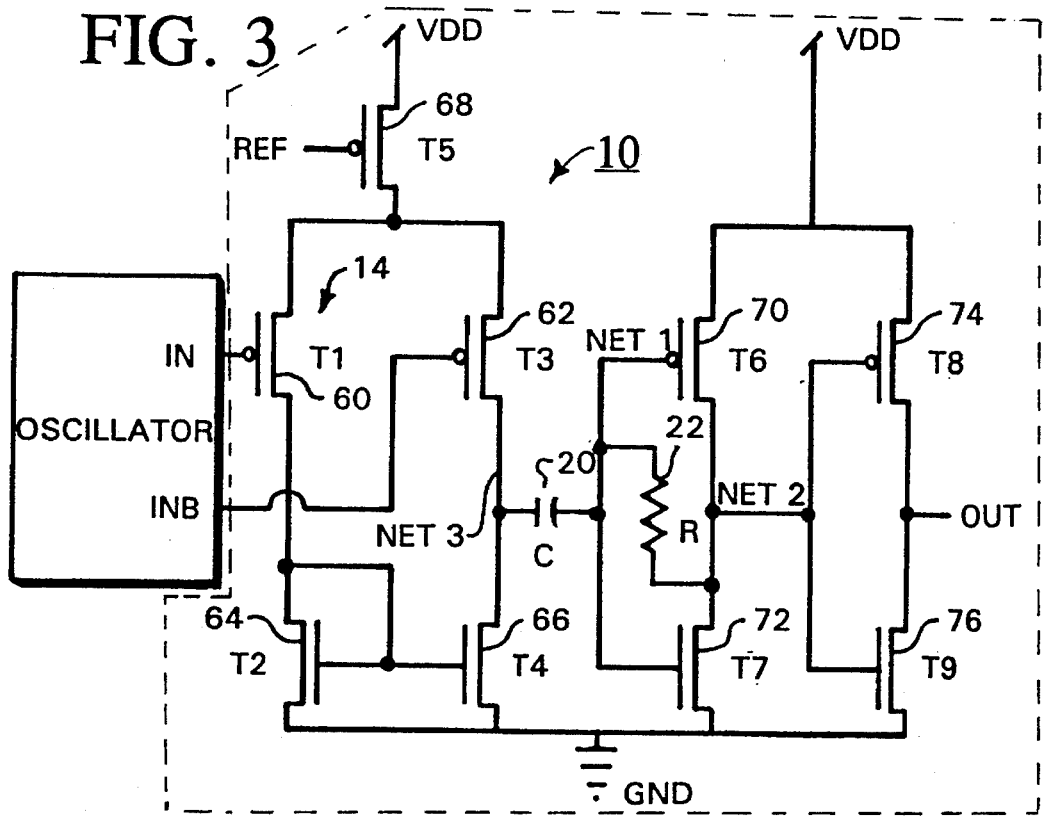

FIG. 2 illustrates a bipolar complementary metal oxide semiconductor (BICMOS) arrangement of the translator circuit 10. An all field effect transistor (FET) translator circuit 10 is shown in FIG. 3. In FIGS. 2 and 3, the same reference numbers are used for similar stages and components as used in FIG. 1. In FIGS. 2 and 3, identical functions of the AC coupling capacitor 20 and resistor 22 are provided as described above with respect to FIG. 1.

Referring to FIG. 2, the oscillator differential outputs IN and INB of the oscillator 12 are applied to a bipolar differential transistor pair or a respective base of NPN transistors 30 and 32 of the differential to single-ended amplifier stage 14. A pair of load resistors 34 and 36 are connected between the supply voltage VDD and a respective collector of the NPN transistors 30 and 32. A pair of current source N-channel field effect transistors (NFETs) 38 and 40 including a reference gate input labelled REF are connected to the emitters of NPN transistors 30 and 32 and an emitter follower NPN transistor 42. The emitter follower NPN transistor 42 is driven by the differential stage 14 providing at its emitter a follower voltage labelled NET 3.

The first inverter generally designated as 16 is driven by the differential stage 14. The first inverter 16 includes a PFET 44 and an NFET 46 connected in series between the supply voltage VDD and ground potential. The second inverter generally designated as 18 following the first inverter 16 includes a PFET 48 and an NFET 50. The second inverter 18 should have the same beta ratio as the first inverter 16 to facilitate better control of the output duty cycle. The AC coupling capacitor (C) 20 is connected between a gate input labelled NET 1 of the inverter 16 and the output labelled NET 3 of the emitter follower 42. The feedback resistor 22 is connected between the input NET 1 and output NET 2 of the first inverter 16. The emitter follower transistor 42 provides a low impedance output at NET 3 for driving the capacitor 20. NET 1 of the capacitor 20 is charged to the trip-point of the first inverter 32 by virtue of the feedback resistor 22. As temperature varies the base-to-emitter voltage of the emitter follower 42 changes, causing the average voltage of NET 1 to vary until the feedback resistor 22 effectively adjusts the voltage at NET 1.

Referring to FIG. 3, the differential outputs IN and INB from the oscillator 12 are applied to the differential stage to single-ended amplifier stage 14. The differential stage 14 includes a pair of P-channel field effect transistors (T1, T3) 60 and 62 and a pair of N-channel field effect transistors (T2 and T4) 64 and 66. A current source PFET (T5) 68 is connected between a supply voltage VDD and PFETs T1 and T3, 60 and 62. The first inverter 16 includes a PFET (T6) 70 and an NFET (T7) 72 and a second inverter includes a PFET (T8) 74 and an NFET (T9) 76. The output of the differential stage labelled NET 1 drives the first inverter PFET T6 and NFET T7, 70 and 72. The second inverter PFET T8 and NFET T9, 74 and 76, driven by the first inverter, provides the translated voltage output labelled OUT.

While the invention has been described with reference to details of the illustrated embodiments, these details are not intended to limit the scope of the invention as defined in the appended claims.

We claim:

1. Apparatus for generating a clock signal comprising:
    first differential means having an input and an output for receiving differential oscillator outputs at said input and for generating at said output a differential amplified voltage output signal;
    a first inverter having an input and an output;
    a second inverter having an input and an output, said second inverter input coupled to said first inverter output;
    AC coupling means for AC coupling said differential amplified voltage output signal to said first inverter input; and
    feedback means for applying a feedback control signal from said first inverter output to said first inverter input, wherein said feedback means include a resistor connected between said first inverter output and said first inverter input, said resistor having a predetermined resistance value.

2. Apparatus as recited in claim 1 wherein said AC coupling means include a capacitor, said capacitor coupled between said output of said first differential means and said first inverter input.

3. Apparatus as recited in claim 1 wherein said first differential means include a plurality of transistors.

4. Apparatus as recited in claim 1 wherein said first differential means include a pair of bipolar differential transistors, each having a base and receiving a respective one of said differential oscillator outputs at said base.

5. Apparatus as recited in claim 1 wherein said first differential means include at least one field effect transistor.

6. Apparatus as recited in claim 1 wherein each of said first inverter and said second inverter includes a plurality of transistors.

7. Apparatus as recited in claim 1 wherein each of said first inverter and said second inverter includes a pair of field effect transistors.

8. Apparatus as recited in claim 7 wherein each said pair of field effect transistors includes an N-channel field effect transistor and a P-channel field effect transistor.

9. Apparatus as recited in claim 1 wherein said AC coupling means include a capacitor and an emitter follower transistor stage connecting said first differential means and said capacitor.

10. A method for generating a clock signal comprising the steps of:
    applying a low voltage oscillator signal to an amplifier for generating an amplified voltage signal;
    AC coupling said amplified voltage signal to an input of a first inverter;

driving a second inverter with an output of said first inverter; and supplying a feedback signal from said output to said input of said first inverter, wherein said step of supplying a feedback signal from said output to said input of said first inverter includes the step of providing a feedback resistor between said output and said input of said first inverter.

11. A method as recited in claim 10 wherein said step of AC coupling said amplified voltage signal to said input of said first inverter includes the step of providing an AC coupling capacitor between an output of said amplifier and said input of said first inverter.

12. Apparatus for translating a continuous oscillator output voltage signal into a predetermined supply signal comprising:

first amplifier means for receiving and amplifying the continuous oscillator output voltage signal to generate an amplified voltage signal;

a first inverter coupled to the first amplifier means;

a second inverter coupled to the first inverter;

AC coupling means for AC coupling said first amplifier means to the first inverter; wherein said AC coupling means include a capacitor, said capacitor coupled between an output of said first amplifier means and an input of said first inverter; and feedback means for applying a feedback control signal from an output to an input of said first inverter; wherein said feedback means include a resistor connected between said first inverter output and said first inverter input.

13. Apparatus as recited in claim 12 wherein said resistor has a selected resistance value and a time constant is determined by said selected resistance value of said resistor and a capacitance value of said capacitor, said time constant is substantially higher than a cycle time of the continuous oscillator output voltage signal.

14. Apparatus as recited in claim 12 wherein said first inverter includes a pair of field effect transistors.

15. Apparatus as recited in claim 14 wherein each said pair of field effect transistors includes an N-channel field effect transistor and a P-channel field effect transistor.

\* \* \* \* \*